US006938629B2

(12) United States Patent
Yeh

(10) Patent No.: US 6,938,629 B2
(45) Date of Patent: Sep. 6, 2005

(54) RINSING LID FOR WET BENCH

(75) Inventor: Chia-Lin Yeh, Tainan (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 252 days.

(21) Appl. No.: 10/292,873

(22) Filed: Nov. 13, 2002

(65) Prior Publication Data
US 2004/0089331 A1 May 13, 2004

(51) Int. Cl.⁷ ................................................ B08B 3/02
(52) U.S. Cl. ........................ 134/198; 134/200; 134/902
(58) Field of Search ................................ 134/200, 902, 134/198, 199, 201, 186, 155; 239/589, 554, 592, 555, 594, 558, 601, 559, 590.3, 593, 560, 561

(56) References Cited

U.S. PATENT DOCUMENTS

| | | | | | |
|---|---|---|---|---|---|
| 4,132,567 | A | * | 1/1979 | Blackwood | .................... 134/1 |
| 4,393,807 | A | * | 7/1983 | Fujimura et al. | ........... 118/501 |
| 4,827,867 | A | * | 5/1989 | Takei et al. | .................... 118/64 |
| 5,039,349 | A | * | 8/1991 | Schoeppel | .................... 134/26 |
| 5,595,602 | A | * | 1/1997 | Harlan | .................... 118/715 |
| 5,762,708 | A | * | 6/1998 | Motoda et al. | ................ 118/52 |
| 5,839,455 | A | * | 11/1998 | Turner et al. | ............. 134/57 R |
| 5,850,841 | A | * | 12/1998 | Han et al. | ...................... 134/86 |
| 5,868,865 | A | * | 2/1999 | Akimoto | ...................... 134/33 |
| 6,019,843 | A | * | 2/2000 | Park et al. | ..................... 118/52 |
| 6,033,135 | A | * | 3/2000 | An et al. | ..................... 396/611 |
| 6,096,100 | A | * | 8/2000 | Guldi et al. | ................ 29/25.01 |
| 6,109,278 | A | * | 8/2000 | Shindo et al. | ............. 134/56 R |
| 6,119,367 | A | * | 9/2000 | Kamikawa et al. | ........... 34/401 |
| 6,173,916 | B1 | * | 1/2001 | Krone-Schmidt | ........ 239/590.3 |
| 6,284,055 | B1 | * | 9/2001 | Dryer et al. | ................... 134/10 |
| 6,390,104 | B1 | * | 5/2002 | Gagnon | ....................... 134/107 |
| 6,647,996 | B2 | * | 11/2003 | Dunn | ......................... 134/25.4 |
| 2001/0052556 | A1 | * | 12/2001 | Ting et al. | .................... 239/556 |

FOREIGN PATENT DOCUMENTS

| | | | |
|---|---|---|---|
| CH | 672449 | * | 11/1989 |
| JP | 58-190031 | * | 11/1983 |
| JP | 62-81715 | * | 4/1987 |
| JP | 63-47935 | * | 2/1988 |
| JP | 3-131026 | * | 6/1991 |

* cited by examiner

Primary Examiner—Frankie L. Stinson
(74) Attorney, Agent, or Firm—Tung & Associates

(57) ABSTRACT

A rinsing lid for a wet bench cleaning chamber used in the rinsing of acids, chemicals and/or particles from semiconductor wafers. The rinsing lid includes a lid housing having an upper water reservoir for receiving a stream of deionized water or other cleaning liquid. A water distribution plate is provided in the lid housing beneath the water reservoir. Small water openings extend through the water distribution plate at the water inlet end, and large water openings extend through the water distribution plate at the opposite end, of the lid housing. A nozzle plate provides multiple nozzle openings in the lid housing beneath the water distribution plate. The large water openings at the end of the lid housing opposite the water inlet end compensate for diminishing water pressure along the length of the lid housing, providing water sprays of uniform force and volume.

19 Claims, 2 Drawing Sheets

RINSING LID FOR WET BENCH

FIELD OF THE INVENTION

The present invention relates to processes and equipment for removing potential circuit-contaminating particles from WIP (work-in-process) semiconductor wafers in the semiconductor fabrication industry. More particularly, the present invention relates to a rinsing lid for a QDR (quick dump rinse) wet bench, which rinsing lid enhances the spray uniformity of deionized water or other rinsing fluid on multiple semiconductor wafers during a quick dump rinse cycle in a wet bench to improve uniformity in the particle-removing capability of the wet bench.

BACKGROUND OF THE INVENTION

Generally, the process for manufacturing integrated circuits on a silicon wafer substrate typically involves deposition of a thin dielectric or conductive film on the wafer using oxidation or any of a variety of chemical vapor deposition processes; formation of a circuit pattern on a layer of photoresist material by photolithography; placing a photoresist mask layer corresponding to the circuit pattern on the wafer; etching of the circuit pattern in the conductive layer on the wafer; and stripping of the photoresist mask layer from the wafer. Each of these steps, particularly the photoresist stripping step, provides abundant opportunity for organic, metal and other potential circuit-contaminating particles to accumulate on the wafer surface.

In the semiconductor fabrication industry, minimization of particle contamination on semiconductor wafers increases in importance as the integrated circuit devices on the wafers decrease in size. With the reduced size of the devices, a contaminant having a particular size occupies a relatively larger percentage of the available space for circuit elements on the wafer as compared to wafers containing the larger devices of the past. Moreover, the presence of particles in the integrated circuits compromises the functional integrity of the devices in the finished electronic product. Currently, mini-environment based IC manufacturing facilities are equipped to control airborne particles much smaller than 1.0 $\mu$m, as surface contamination continues to be of high priority to semiconductor manufacturers. To achieve an ultra-clean wafer surface, particles must be removed from the wafer, and particle-removing methods are therefore of utmost importance in the fabrication of semiconductors.

The most common system for cleaning semiconductor wafers during wafer processing includes a series of tanks which contain the necessary cleaning solutions and are positioned in a "wet bench" in a clean room. Batches of wafers are moved in sequence through the tanks, typically by operation of a computer-controlled automated apparatus. Currently, semiconductor manufacturers use wet cleaning processes which may use cleaning agents such as deionized water and/or surfactants. Other wafer-cleaning processes utilize solvents, dry cleaning using high-velocity gas jets, and a megasonic cleaning process, in which very high-frequency sound waves are used to dislodge particles from the wafer surface. Cleaning systems which use deionized (DI) water currently are widely used in the industry because the systems are effective in removing particles from the wafers and are relatively cost-efficient. Approximately 4.5 tons of water are used for the production of each 200-mm, 16-Mbit, DRAM wafer.

A conventional KAIJO (trademark) PRS wet bench cleaning chamber, in use, is generally indicated by reference numeral 10 in cross-section in FIG. 1, and a longitudinal sectional view of the wet bench cleaning chamber 10 is shown in FIG. 2. The wet bench cleaning chamber 10 is typically used to rinse acid residue from wafers after the wafers are subjected to etching or other processing, for example. Typical uses for the chamber 10 include SPM cleaning, APM cleaning, PRS (photoresist stripping) cleaning and M2 etch/cleaning, for example. The chamber 10 includes chamber walls 12 that define a chamber interior 14 which receives multiple wafers 16. The chamber 10 typically includes a top opening 15, above which is disposed a pair of parallel overhead shower tubes 18, each of which is provided with multiple, adjacent nozzle openings 19. A pair of elongated, parallel bottom shower tubes 20, each provided with multiple adjacent nozzle openings 21, is provided in the bottom of the chamber interior 14. A wafer boat or other wafer support (not illustrated) removably contained in the chamber interior 14 typically holds up to fifty of the semiconductor wafers 16 in horizontally-adjacent relationship to each other, with the nozzle openings 19 of the respective overhead shower tubes 18 directed toward the upper edge portions of the wafers 16 and the nozzle openings 21 of the respective bottom shower tubes 20 directed toward the lower edge portions of the wafers 16.

In use, the overhead shower tubes 18 and the bottom shower tubes 20 are each connected to a source (not illustrated) of DI (deionized) water. In a quick dump rinse cycle, DI water 22 flows into a water inlet end 18a of each overhead shower tube 18 and into a water inlet end 20a of each bottom shower tube 20. The DI water flows from the overhead shower tubes 18 and the bottom shower tubes 20 through the nozzle openings 19 and 21, respectively, in a DI water spray 24 at a water flow rate of typically about 4,000–5,000 1/hr. Each nozzle opening 19, 20 ejects and disperses the DI water toward the wafers 16 in a relatively narrow-angled DI water spray 24, indicated by the dashed lines in FIGS. 1 and 2. Accordingly, the pressurized DI water spray 24 ejected from each nozzle opening 19, 21 is sufficiently wide to flow across the surfaces of typically about four consecutive, horizontally-spaced wafers 16, such that the wafers 16 are showered with the DI water sprays 24 and potential circuit-contaminating particles (not illustrated) are dislodged and removed from the upper and lower surfaces of the showered wafers 16.

One of the limitations inherent in the conventional DI water cleaning chamber or system 10 is that the DI water sprays 24 tend to progressively decrease in intensity along each overhead shower tube 18 from the water inlet end 18a thereof and along each bottom shower tube 20 from the water inlet end 20a thereof. This is due to progressively decreasing water pressure from the inlet ends 18a, 20a to the opposite ends of the respective shower tubes 18, 20. Therefore, the nozzle openings 19, 21 typically fail to provide a uniform spread of the DI water spray 24 along the surfaces of all of the wafers 16 in the chamber interior 14. Consequently, some of the wafers 16, particularly those closest to the inlet end 18a of each overhead shower tube 18 and the inlet end 20a of each bottom shower tube 20, are sprayed in a sufficient manner to rinse most or all of the acid, chemicals and particles from the surfaces of those wafers 20, whereas other wafers 16, particularly those furthest away from the inlet end 18a of each overhead shower tube 18 and the inlet end 20a of each bottom shower tube 20, remain inadequately sprayed by the DI water sprays 24. Thus, some of the acids and/or chemicals, as well as potential wafer-contaminating particles, remain on the surfaces of these inadequately-showered wafers 16.

Another problem frequently encountered in use of the conventional wet bench cleaning chamber 10 is that the wafers 16 tend to inadvertently shift in the chamber interior 14 as they are sprayed by the DI water sprays 24. Moreover, because the top opening 15 typically remains uncovered by a lid or cover during rinsing of the wafers 16, droplets of acids or other chemicals or particles being washed from the wafers 16 may become airborne and contaminate other wafer processing equipment in the vicinity of the chamber 10. Accordingly, a rinsing lid is needed for thorough rinsing of all semiconductor wafers in a wet bench cleaning chamber.

An object of the present invention is to provide a rinsing lid for a wet bench used in the rinsing of chemicals and/or particles from semiconductor wafers.

Another object of the present invention is to provide a multi-purpose rinsing lid which is suitable for a KAIJO (trademark) wet bench used in the rinsing of semiconductor wafers.

Still another object of the present invention is to provide a rinsing lid for a wet bench cleaning chamber, which rinsing lid is capable of thoroughly and uniformly rinsing multiple semiconductor wafers in the chamber.

Yet another object of the present invention is to provide a rinsing lid for a wet bench cleaning chamber, which rinsing lid is capable of retaining and substantially preventing or limiting inadvertent shifting of semiconductor wafers in the chamber during wet clean rinsing of the wafers.

Still another object of the present invention is to provide a rinsing lid for preventing splashing of acids, chemicals or particles from a wet bench cleaning chamber during wet clean rinsing of the wafers in the chamber.

A still further object of the present invention is to provide a rinsing lid for a wet bench cleaning chamber, which rinsing lid facilitates substantially uniform DI water pressure along the entire length of the lid as the water is sprayed from the lid for the uniform and thorough rinsing of wafers in the chamber.

SUMMARY OF THE INVENTION

In accordance with these and other objects and advantages, the present invention is generally directed to a rinsing lid for a wet bench cleaning chamber used in the rinsing of acids, chemicals and/or particles from semiconductor wafers. The rinsing lid includes a lid housing having an upper water reservoir for receiving a stream of DI (deionized water) or other cleaning liquid. A water distribution plate is provided in the lid housing beneath the water reservoir. Small water openings extend through the water distribution plate at the water inlet end, and large water openings extend through the water distribution plate at the opposite end, of the lid housing. A nozzle plate provided with multiple nozzle openings is provided in the lid housing beneath the water distribution plate. The large water openings at the end of the lid housing opposite the water inlet end thereof compensate for diminishing water pressure along the length of the lid housing to provide water sprays of substantially uniform force and volume along the entire length of the water distribution plate. Consequently, the wafers in the chamber are thoroughly and uniformly sprayed to remove acid, chemicals and/or particles from the wafers.

At least one wafer stabilizing rod may be provided on the bottom surface of the rinsing lid for engaging, stabilizing and preventing inadvertent shifting of the multiple adjacent wafers inside the chamber during the rinsing process. The rinsing lid closes the upper chamber opening to prevent splashing of acid and/or chemical droplets, as well as particles, from the chamber during the rinsing process.

BRIEF DESCRIPTION OF THE DRAWINGS

The invention will now be described, by way of example, with reference to the accompanying drawings, in which.

DESCRIPTION OF THE PREFERRED EMBODIMENTS

Figure 1:
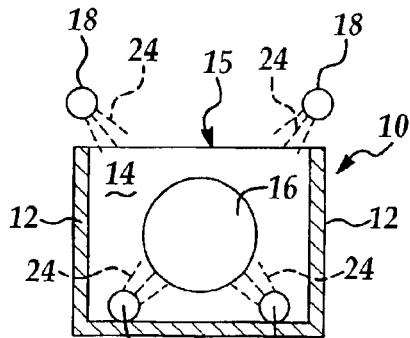
FIG. 1 is a cross-sectional view of a conventional KAIJO (trademark) wet bench cleaning chamber, in use.
Figure 2:
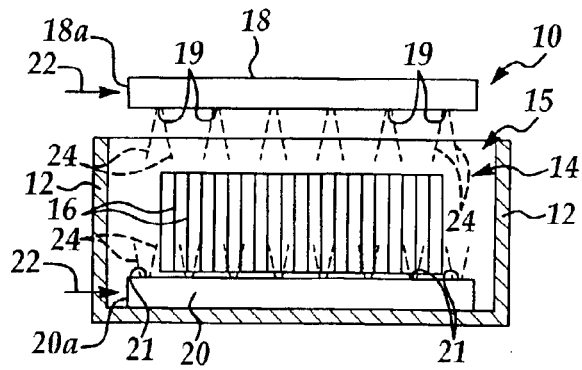
FIG. 2 is a longitudinal sectional view of a conventional KAIJO (trademark) wet bench cleaning chamber, in use.

The present invention has particularly beneficial utility in the thorough and uniform rinsing of semiconductor wafer substrates in a wet bench cleaning chamber such as a KAIJO (trademark) wet bench cleaning chamber, which is used extensively in the art for the purpose. However, the invention is not so limited in application, and while references may be made to such wet bench cleaning chamber, it is understood that the present invention may be applicable to rinsing substrates in a variety of industrial and mechanical applications. Furthermore, it is understood that the present invention may be applicable to wet bench cleaning chambers other than KAIJO (trademark) wet bench cleaning chambers.

Referring next to FIGS. 3–6, an illustrative embodiment of the rinsing lid of the present invention is generally indicated by reference numeral 30 and includes a lid housing 31 typically having a generally elongated, rectangular configuration. The lid housing 31 includes a top panel 32 having downwardly-extending walls 34. A water inlet opening 36, the purpose of which will be hereinafter described, extends through the wall 34 at one end of the lid housing 31.

Figure 3:
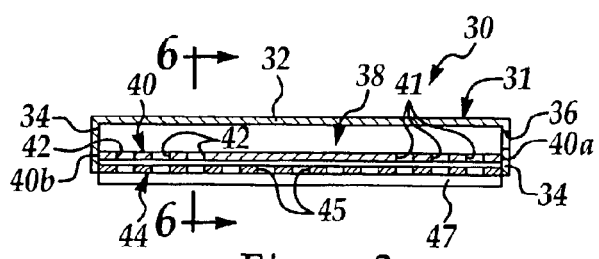
FIG. 3 is a longitudinal sectional view of an illustrative embodiment of a wet bench cleaning chamber rinsing lid of the present invention.
Figure 4:
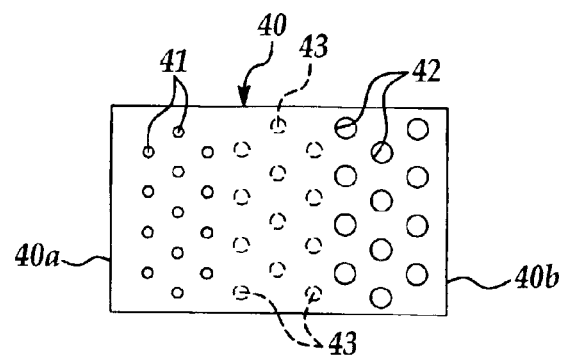
FIG. 4 is a top view of a water distribution plate element of the rinsing lid of the present invention.

As further shown in FIG. 3, a water distribution plate 40 is provided in the lid housing 31, beneath the top panel 32. A water reservoir 38 is defined between the top panel 32 and the water distribution plate 40. As shown in FIG. 4, the water distribution plate 40 includes a water inlet end 40a which, as shown in FIG. 3 is disposed just beneath the water inlet opening 36 of the lid housing 31, and a distal end 40b opposite the water inlet end 40a. Multiple inlet end water openings 41 extend in a selected pattern through the water distribution plate 40 adjacent to the water inlet end 40a. Multiple distal end water openings 42, each of which has a width or diameter that is larger than that of each of the inlet end water openings 41, extend in a selected pattern through the water distribution plate 40 adjacent to the distal end 40b. In a preferred embodiment, each of the inlet end water openings 41 has a width or diameter of about 5 mm, whereas each of the larger distal end water openings 42 has a width or diameter of about 10 mm. However, it will be recognized by those skilled in the art that the inlet end water openings 41 and the distal end water openings 42 may have other dimensions. Intermediate water openings 43, each having a width or diameter between that of the inlet end water openings 41 and the distal end water openings 42, may extend through the water distribution plate 40 between the inlet end water openings 41 and the distal end water openings 42.

As further shown in FIG. 3, a nozzle plate 44 is provided in the lid housing 31, beneath the water distribution plate 40. Multiple nozzles 45 are provided in a selected pattern in the nozzle plate 44. The nozzles 45 are typically more or less evenly distributed throughout the area of the nozzle plate 44, and each may have substantially the same width or diameter as the others. Preferably, either or both of the nozzle plate 44 and the nozzles 45 are constructed of polytetrafluoroethylene, or TEFLON (trademark), since that material is chemically inert and therefore, resists corrosion by such acids as hydrogen fluoride (HF). However, it is understood that the nozzle plate 44 and/or the nozzles 45 may be constructed of other materials suitable for the purpose.

Figure 5:
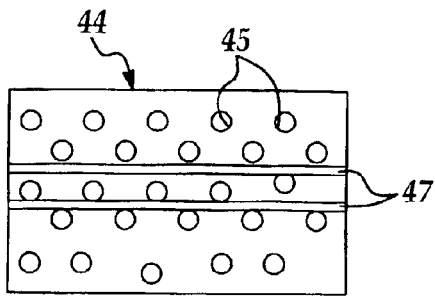
FIG. 5 is a bottom view of a nozzle plate element of the rinsing lid of the present invention.
Figure 6:
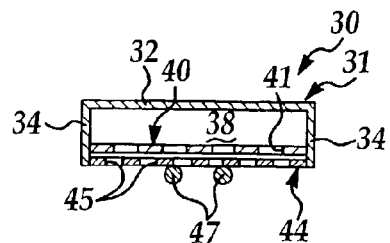
FIG. 6 is a cross-sectional view, taken along section lines 6—6 in FIG. 3, of the rinsing lid.

As shown in FIGS. 5 and 6, at least one, and preferably, two elongated, parallel wafer stabilizing rods 47 are provided on the bottom surface of the nozzle plate 44, between the nozzles 45. Each of the wafer stabilizing rods 47 is preferably constructed of polytetrafluoroethylene, or TEFLON (trademark), since that material resists acid and other chemical corrosion. However, it is understood that the wafer stabilizing rods 47 may alternatively be constructed of other materials suitable for the purpose. In a preferred embodiment, each of the wafer stabilizing rods 47 has a diameter of typically about 10 mm, but may have a larger or smaller diameter, as desired. When the rinsing lid 30 is mounted in functional configuration on a wet bench cleaning chamber 50, as shown in FIG. 7 and hereinafter further described, the wafer stabilizing rods 47 engage and stabilize multiple semiconductor wafers 56 and prevent inadvertent shifting of the wafers 56 during rinsing of the wafers 56 in the chamber 50.

Figure 7:
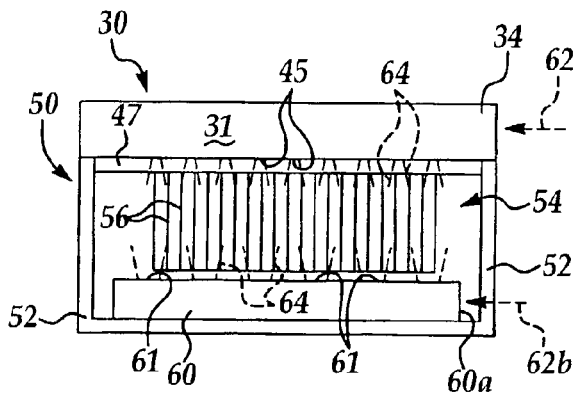
FIG. 7 is a longitudinal sectional view of a wet bench cleaning chamber, with the rinsing lid of the present invention mounted on the wet bench cleaning chamber in implementation of the present invention.
Figure 8:
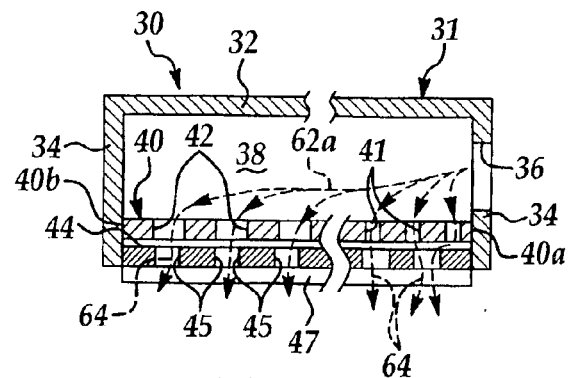
FIG. 8 is a longitudinal sectional view, partially in section, of the rinsing lid of the present invention, more particularly illustrating a typical flow path of water or cleaning liquid through the rinsing lid and from nozzle openings in the nozzle plate thereof.

Referring next to FIGS. 7 and 8, in typical application the rinsing lid 30 of the present invention is removably mounted on a wet bench cleaning chamber 50, which may be a conventional KAIJO (trademark) wet bench cleaning chamber, for example. The wet bench cleaning chamber 50 is typically used to rinse acid, chemical or particulate residues from multiple, typically fifty (two lots) of semiconductor wafers 56, after the wafers 56 are subjected to etching or other processing during the course of fabricating integrated circuits on the wafers 56. Typical uses for the chamber 50 include SPM cleaning, APM cleaning, PRS (photoresist stripping) cleaning and M2 etch/cleaning, for example. The chamber 50 includes chamber walls 52 that define a chamber interior 54 which receives the multiple wafers 56. A pair of elongated, parallel bottom shower tubes 60 (one of which is shown in FIG. 7), each provided with multiple adjacent nozzle openings 61, is provided in the bottom of the chamber interior 54. A wafer boat or other wafer support (not illustrated) removably contained in the chamber interior 54 typically holds up to fifty of the semiconductor wafers 56 in horizontally-adjacent relationship to each other, with the nozzle openings 61 of the respective bottom shower tubes 60 directed toward the lower edge portions of the wafers 56. When the rinsing lid 30 is mounted in functional position on the chamber 50, the bottom edge of the lid housing walls 34 rests on the upper edge of the chamber walls 52. A gasket (not shown) or other seal may be interposed between the lid housing walls 34 and the chamber walls 52, as desired. When the rinsing lid 30 is so mounted on the chamber 50, the nozzle openings 45 are positioned directly above the wafers 56. The wafer stabilizing rods 47 (one of which is shown in FIG. 7) engage the upper edge of each of the multiple wafers 56 to prevent inadvertent horizontal shifting of the wafers 56 in the chamber interior 54 during rinsing, as hereinafter further described.

In use, the lid housing 31 is confluently connected to a source (not shown) of DI water or other rinsing liquid 62a. The bottom shower tubes 60 are further connected to a source (not shown) of DI water 62b. In a QDR (quick dump rinse) cycle, the DI water 62a flows into the water reservoir 38 of the lid housing 31, through the water inlet opening 36. Due to the higher pressure of the DI water 62a at the inlet end 40a relative to the distal end 40b of the water distribution plate 40, the DI water 62a has a tendency to flow more readily through the inlet end water openings 41 than through the distal end water openings 42. The larger width or diameter of the distal end water openings 42 serves to compensate for this decreasing water pressure gradient along the length of the lid housing 31. Accordingly, substantially the same volume of DI water 62a flows through the distal end water openings 42 as flows through the inlet end water openings 41. The DI water 62a flowing through both the inlet end water openings 41 and the distal end water openings 42 is then ejected in a DI water spray 64 from the lid housing 31 through the nozzles 45 of the nozzle plate 44. The DI water sprays 64 flow across the surfaces of the wafers 56 to wash residual acid, chemicals or particles from the wafers 56. Because approximately equal volumes of the DI water 62a flow through the distal end water openings 42 and the inlet end water openings 41, each of the DI water sprays 64 among the entire area of the nozzle plate 41 has substantially the same force and volume. Consequently, all of the wafers 56, no matter where located in the chamber interior 54, are substantially equally rinsed and cleaned. It will be appreciated by those skilled in the art that the spray nozzles 45 can be adjusted and optimized based on the process requirements for the rinsing process and the number of wafers 56 being rinsed.

As the DI water sprays 64 are ejected from the respective nozzle openings 45 in the rinsing lid 30 and onto the wafers 56 as heretofore described, DI water 62b flows into a water inlet end 60a of each bottom shower tube 60. The DI water 62b flows from the bottom shower tubes 60 through the nozzle openings 61 in DI water sprays 64. Each nozzle opening 61 ejects and disperses the DI water spray 64 toward the bottom edges of the respective wafers 56 and across the surfaces of the wafers 56, such that each of the wafers 56 is showered from both directions with the DI water sprays 64 ejected from the bottom shower tubes 60 and the DI water sprays 64 ejected from the rinsing lid 30. Accordingly, acids, chemicals and potential circuit-contaminating particles (not illustrated) are removed from the upper and lower surfaces of the showered wafers 16. Because the chamber interior 54 is closed by the rinsing lid 30, acid and chemical droplets, as well as airborne particles, are incapable of being ejected from the chamber 50 and contaminating other equipment in the vicinity of the chamber 50.

While the preferred embodiments of the invention have been described above, it will be recognized and understood that various modifications can be made in the invention and the appended claims are intended to cover all such modifications which may fall within the spirit and scope of the invention.

What is claimed is:

1. A rinsing lid for a cleaning chamber, comprising:
   a lid housing having a water inlet opening;
   a water distribution plate provided in said lid housing, said water distribution plate having a plurality of inlet end water openings of first width and a plurality of distal end water openings of second width larger than said first width spaced from said inlet end water openings;
   a nozzle plate having a plurality of nozzles provided in said lid housing adjacent to said water distribution plate; and
   a wafer stabilizing mechanism carried by said nozzle plate.

2. The rinsing lid of claim 1 wherein said first width is about 5 mm.

3. The rinsing lid of claim 1 wherein said second width is about 10 mm.

4. The rinsing lid of claim 3 wherein said first width is about 5 mm.

5. The rinsing lid of claim 1 wherein each of said plurality of nozzles comprises polytetrafluoroethylene.

6. The rinsing lid of claim 5 wherein said first width is about 5 mm.

7. The rinsing lid of claim 5 wherein said second width is about 10 mm.

8. The rinsing lid of claim 7 wherein said first width is about 5 mm.

9. A rinsing lid for a cleaning chamber, comprising:
   a lid housing having a water inlet opening;
   a water distribution plate provided in said lid housing, said water distribution plate having a plurality of inlet end water openings of first width and a plurality of distal end water openings of second width larger than said first width spaced from said inlet end water openings;
   a nozzle plate having a plurality of nozzles provided in said lid housing adjacent to said water distribution plate; and
   at least one wafer stabilizing rod carried by said nozzle plate.

10. The rinsing lid of claim 9 wherein said first width is about 5 mm.

11. The rinsing lid of claim 9 wherein said second width is about 10 mm.

12. The rinsing lid of claim 11 wherein said first width is about 5 mm.

13. The rinsing lid of claim 9 wherein each of said plurality of nozzles comprises polytetrafluoroethylene.

14. The rinsing lid of claim 13 wherein said first width is about 5 mm.

15. The rinsing lid of claim 13 wherein said second width is about 10 mm.

16. The rinsing lid of claim 15 wherein said first width is about 5 mm.

17. A cleaning chamber for cleaning substrates, comprising:
   a chamber wall defining a chamber interior for receiving the substrates;
   a lid housing for engaging said chamber wall, said lid housing having a water inlet opening;
   a water distribution plate provided in said lid housing, said water distribution plate having a plurality of inlet end water openings of first width and a plurality of distal end water openings of second width larger than said first width spaced from said inlet end water openings;
   a nozzle plate having a plurality of nozzles provided in said lid housing adjacent to said water distribution plate; and
   at least one wafer stabilizing rod carried by said nozzle plate for stabilizing the substrates in the chamber interior.

18. The rinsing lid of claim 17 wherein said first width is about 5 mm.

19. The rinsing lid of claim 17 wherein said second width is about 10 mm.

* * * * *